United States Patent
Kroner et al.

(10) Patent No.: US 11,619,559 B2
(45) Date of Patent: Apr. 4, 2023

(54) METHOD FOR PRODUCING A PRESSURE SENSOR DEVICE AND PRESSURE SENSOR DEVICE

(71) Applicant: Robert Bosch GmbH, Stuttgart (DE)

(72) Inventors: Elmar Kroner, Tamm (DE); Friedhelm Guenter, Burgstetten (DE); Ingo Kesel, Vaihingen (DE); Joachim Friedl, Reutlingen (DE); Philipp Scheiner, Weil der Stadt (DE); Robert Kuells, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 68 days.

(21) Appl. No.: 17/240,180

(22) Filed: Apr. 26, 2021

(65) Prior Publication Data
US 2021/0341346 A1 Nov. 4, 2021

(30) Foreign Application Priority Data
Apr. 30, 2020 (DE) .......................... 102020205490.8

(51) Int. Cl.
*B81B 3/00* (2006.01)
*G01L 9/00* (2006.01)

(52) U.S. Cl.
CPC .......... *G01L 9/0086* (2013.01); *B81B 3/0018* (2013.01); *B81B 2201/0264* (2013.01)

(58) Field of Classification Search
CPC ................. G01L 9/0086; B81B 3/0018; B81B 2201/0264; B81C 1/00269
See application file for complete search history.

(56) References Cited

U.S. PATENT DOCUMENTS

| | | | | | |
|---|---|---|---|---|---|
| 2,957,334 | A | * | 10/1960 | Essmann | G01L 27/005 73/1.68 |
| 4,549,439 | A | * | 10/1985 | Keen | G01G 3/1402 73/862.634 |
| 4,686,764 | A | * | 8/1987 | Adams | G01L 19/141 156/303.1 |
| 4,732,042 | A | * | 3/1988 | Adams | G01L 19/147 338/42 |

(Continued)

FOREIGN PATENT DOCUMENTS

| | | |
|---|---|---|
| EP | 1336086 A1 | 8/2003 |
| WO | 0233372 A1 | 4/2002 |

*Primary Examiner* — David J Bolduc
(74) *Attorney, Agent, or Firm* — Norton Rose Fulbright US LLP; Gerard Messina

(57) ABSTRACT

A method for producing a pressure sensor device. The method includes providing a vessel that includes a cavity having side walls, the cavity including a floor and the side walls each including an upper side, which face away from the floor; providing a pressure sensor and situating the pressure sensor in the cavity and on the floor; filling the cavity with an oil so that the oil fills the cavity up to the upper sides of the side walls; applying a membrane onto the surface of the oil that completely covers the oil, and at least in some regions onto the upper sides of the side walls so that the membrane covers, circumferentially around the cavity, those regions of the upper sides of the side walls that lie against the oil, the membrane including a liquid material when applied onto the oil; and curing the liquid material of the membrane.

13 Claims, 2 Drawing Sheets

(56) References Cited

U.S. PATENT DOCUMENTS

| | | | | |
|---|---|---|---|---|
| 4,842,685 A | * | 6/1989 | Adams | G01L 19/0084 |
| | | | | 264/254 |
| 4,993,265 A | * | 2/1991 | Koen | G01L 19/0627 |
| | | | | 361/283.4 |
| 5,459,351 A | * | 10/1995 | Bender | G01L 19/143 |
| | | | | 257/419 |
| 6,140,144 A | * | 10/2000 | Najafi | B81C 1/00269 |
| | | | | 438/54 |
| 6,946,728 B2 | * | 9/2005 | Chen | B81C 1/00293 |
| | | | | 257/777 |
| 10,549,982 B2 | * | 2/2020 | Duqi | B81B 3/0094 |
| 2001/0020320 A1 | * | 9/2001 | McIntosh | G01P 15/125 |
| | | | | 73/514.32 |
| 2005/0204823 A1 | * | 9/2005 | Murai | G01L 19/0084 |
| | | | | 73/724 |
| 2006/0243053 A1 | * | 11/2006 | Banholzer | G01L 9/0075 |
| | | | | 73/715 |
| 2011/0121414 A1 | * | 5/2011 | Rothacher | H01L 23/315 |
| | | | | 257/416 |
| 2016/0209285 A1 | * | 7/2016 | Nakajima | G01L 19/0069 |
| 2017/0089774 A1 | * | 3/2017 | Rykaczewski | H01H 29/06 |
| 2017/0233245 A1 | * | 8/2017 | Duqi | B81B 7/0041 |
| | | | | 257/419 |
| 2018/0148316 A1 | * | 5/2018 | Duqi | B81B 3/0094 |
| 2018/0186622 A1 | * | 7/2018 | Mögelin | B81B 3/0045 |
| 2019/0178738 A1 | * | 6/2019 | Kawano | G01L 9/0041 |
| 2020/0055727 A1 | * | 2/2020 | Rajaraman | B81B 7/0029 |

* cited by examiner

METHOD FOR PRODUCING A PRESSURE SENSOR DEVICE AND PRESSURE SENSOR DEVICE

CROSS REFERENCE

The present application claims the benefit under 35 U.S.C. § 119 of German Patent Application No. DE 102020205490.8 filed on Apr. 30, 2020, which is expressly incorporated herein by reference in its entirety.

FIELD

The present invention relates to a method for producing a pressure sensor device, and to a pressure sensor device.

BACKGROUND INFORMATION

Conventional pressure sensors can be made watertight, and in addition can be filled with a gel. A pressure fluctuation can be transmitted to the gel, and thus further transmitted, through the gel, to a pressure sensor that can be situated in the gel. However, in order to enable reduction of losses in the transmission of the pressure signal through the medium, in this case the gel, to the pressure sensor, it is desirable to select a medium that causes as little damping as possible of the pressure signal when this signal propagates through the medium.

In European Patent No. EP 1336086 B1, a pressure measurement cell is described having a membrane that is connected to a measurement chamber. During operation, the membrane can undergo a deflection that is a function of a pressure to be measured. Here, an electrode can form, together with a counter-electrode attached on the membrane, a capacitor whose capacitance is a measure of the deflection of the membrane.

SUMMARY

The present invention provides a method for producing a pressure sensor device, and a pressure sensor device.

Preferred developments of the present invention are disclosed herein.

In accordance with example embodiments of the present invention, a method for producing a pressure sensor device, as well as a pressure sensor device resulting therefrom, are provided, in which a medium can be used having a low damping, or almost no damping, and the medium can be covered by a membrane via which the medium can be sealed from the surrounding environment in airtight, oil-tight, and watertight fashion, and without gas inclusions, the lifetime of the pressure sensor device being capable of being increased, the joining process of the membrane on the medium being capable of being simplified, and the sealing of the medium, as well as the transmission of the pressure signal, being capable of being improved.

According to an example embodiment of the present invention, in the method for producing a pressure sensor device a vessel is provided that includes a cavity having side walls, the cavity including a floor and the side walls each including an upper side, which face away from the floor; a pressure sensor is provided and the pressure sensor is situated in the cavity and on the floor; a filling of the cavity with an oil is provided in such a way that the oil fills the cavity up to the upper sides of the side walls and forms a surface; an application of a membrane onto the surface of the oil is provided that completely covers the oil, and at least in some regions onto the surfaces of the side walls in such a way that the membrane covers, circumferentially around the cavity, those regions of the upper sides of the side walls that lie against the oil, the membrane including a liquid material when applied onto the oil; and curing of the liquid material of the membrane takes place.

In other words, the membrane can extend over the oil and at least in some regions over the upper sides of the side walls, and can form a flat surface on an upper side facing away from the oil.

The vessel can be a plastic vessel that can include side walls extending vertically from the floor that can form the cavity and can run around it circumferentially. The pressure sensor on the floor can advantageously be situated at a distance from all side walls.

In comparison with a conventional gel filling, an oil filling according to the present invention, with the membrane lying thereon, can have a lower degree of damping and can also offer a relatively high degree of precision of the pressure sensor system. The membrane can advantageously seal the cavity in airtight, oil-tight, and watertight fashion. Consequently, a medium can be placed in the cavity, such as the gel or some other maximally incompressible medium (liquid), and here the sealing of the cavity by the membrane can advantageously be airtight, oil-tight, and watertight, or more generally media-tight, such that advantageously the gel (oil or some other medium) cannot exit from the cavity, or can do so only to a very small degree, and no, or only very little, foreign material of any kind can enter the cavity. Although the following description refers to an oil, instead of the oil any other type of incompressible liquid may also be used.

In addition, the side walls can run completely around the cavity laterally, and the membrane can in addition terminate the cavity at all regions of the upper sides of the side walls, and the upper side of the side walls can cover at least the regions facing (lying on) the cavity and extend over the cavity.

A pressure sensor device that can be produced by the method can be installed, for example as a MEMS component, in a mobile telephone (smart phone) or a clock or some other device, and can be used there for pressure measurement, navigation (indoor or outdoor), or for determining position (tracking, e.g. in fitness contexts). The construction and connection designs can be a differentiating feature for highly precise and (water-)tight, as well as user-oriented, pressure sensors.

Using the membrane, the interior of the cavity can advantageously be sealed in media-tight fashion, and pressure fluctuations from outside can advantageously also easily be transmitted to the oil and thus to the pressure sensor. In the interior of the cavity, and within the membrane, the oil filling can then advantageously carry out the forwarding of the pressure fluctuation to the pressure sensor. For this purpose, as few air inclusions (gas inclusions) as possible should exist between oil and the membrane, in order not to modify the pressure signal inside the cavity, because gas inclusions can have a much higher compressibility than oil does. The oil can also be replaced by some other liquid or an oil mixture; it is necessary only for it to have a high degree of incompressibility. The oil volume can advantageously be sealed in watertight fashion and so as to be tight against gas entry.

The membrane can advantageously be applied to the oil using a joining method that is suitable for series production and robust, as well as low in cost.

The application of the membrane in liquid form and the subsequent cross-linking or curing can correspond to a so-called in situ method.

In this way, an air inclusion between the membrane and surface of the oil can advantageously be reduced or even prevented, because a liquid, when applied, can easily and effectively expel the gas present there.

The application of the liquid membrane can advantageously take place using a precision dispenser or an atomizer.

Through the production according to an example embodiment of the present invention, a separate production and application (handling) of small and thin membranes applied to the oil in finished form can be omitted. In addition, an additional joining process of the membrane to the side walls can be omitted. Through a controlled application of the liquid film of the membrane, air or gas inclusions between the membrane and the oil can be reduced or prevented. Through a rapid cross-linking/curing of the liquid membrane, the cavity can be quickly sealed, so that very short process times can result.

In addition, a material bonding of the vessel and the membrane is possible without having to use complicated welding methods or other technologies for the bonding. As a result, a better and more robust tightness can be achieved, because the omission of welding methods or other technologies can save material.

According to a preferred specific embodiment of the method in accordance with the present invention, the pressure sensor device is realized as a microelectromechanical component.

Such a production variant can advantageously be done in a micro-design, using corresponding MEMS tools.

According to a preferred specific embodiment of the method in accordance with the present invention, the membrane is lipophilic.

The membrane can itself include a lipophilic material, in other words a material that attracts oil or fat. In this way, the oil can be attracted, or at least not repelled, by the membrane material.

According to a preferred specific embodiment of the method in accordance with the present invention, before the application of the membrane onto the upper side of the side walls, a modification is made of a material property of the surface material of the vessel at least in some regions, after which the surface material becomes wettable by the material of the membrane and/or by the oil.

Through the wetting of the upper side of the side walls by the material of the membrane, a media-tight connection between the membrane and the upper side of the side walls can be achieved, and in this way the cavity can be sealed around its circumference in media-tight fashion.

The modification of the material property of the surface material of the vessel can take place at least in some regions with a silane treatment of the surface material, whereby the surface material can become lipophilic.

There can also take place a surface activation of the material of the side walls at their surface, in particular at the upper side of the side walls, which however may also be non-lipophilic. For example, a plasma treatment may be carried out, or a microstructural roughening may be produced.

A surface activation of the material of the side walls may also take place on their inner sides, in such a way that the inner sides can become lipophilic and can become capable of being wetted by the oil (medium). In this way, the oil can advantageously be distributed well over the inner walls in the cavity, and can lie tightly on the side walls.

The modification can for example take place on the upper sides of the side walls, advantageously circumferentially around the cavity. Through the lipophilic, in other words oil-loving or fat-loving, property, the inner walls can become wettable by the oil, partly connected onto the cavity also the upper sides.

According to a preferred specific embodiment of the method in accordance with the present invention, the oil is dosed using a microdispersion method and is introduced into the cavity.

The quantity of the oil can advantageously be dosed precisely, for example using microdispensing methods.

According to a preferred specific embodiment of the method in accordance with the present invention, during application the membrane includes a liquid monomer or oligomer.

The oil and the monomer or the oligomer can advantageously be matched to one another in such a way that a mixture of oil and monomer or of oil and oligomer can be avoided for the most part, or completely. In addition, the monomer or oligomer can advantageously form a uniformly thick layer on the oil and/or on the side wall, for example in order to ensure a surface wetting of the oil and of the side walls. In addition, the surface tension of the monomer or of the oligomer and of the sidewalk can be matched to one another in such a way that a wetting can take place on the side walls in order to enable the membrane to be fixed there, in particular after the curing. This can be achieved for example by a surface activation, as mentioned above, in order to adapt the surface tension(s) at least to correspond to the side wall.

According to a preferred specific embodiment of the method in accordance with the present invention, the material of the membrane is cross-linked or cured by radiation or heat after application onto the oil and onto the upper sides of the side walls.

Through radiation or heat, a cross-linking reaction can be triggered in the monomer or oligomer, whereby this material can cure. The heat can be produced by radiation or heat conduction onto the material of the membrane. The membrane can become stable through the curing, and can become fixedly bonded to the side walls.

After the curing, the membrane can then be a fixed seal of the oil filling that can be fixed on the side walls and can seal the cavity in (water-)tight fashion. A deflection of the membrane can thus transmit a pressure signal into the interior of the cavity.

According to a preferred specific embodiment of the method in accordance with the present invention, a membrane having a homogenous thickness is applied over the cavity and over the side walls.

Through the homogenous thickness, a uniform and predetermined stability of the membrane can be achieved.

According to a preferred specific embodiment of the method in accordance with the present invention, the membrane is applied onto the upper sides of the side walls and onto the oil in such a way that the oil and the upper sides are completely covered, and the material of the membrane is subsequently thinned back to a prespecified thickness.

In order to set a prespecified thickness, the membrane material can be subsequently suctioned off while it is still in the liquid state.

According to an example embodiment of the present invention, the pressure sensor device includes a vessel that includes a cavity having side walls, the cavity including a floor and the side walls each including an upper side, which face away from the floor; a pressure sensor that is situated in the cavity and on the floor; an oil with which the cavity is filled in such a way that the oil fills the cavity up to the upper sides of the side walls and forms a surface; and a membrane that is applied onto the surface of the oil and lies thereon, the membrane completely covering the oil and being applied at least in some regions onto the upper sides of the side walls in such a way that the membrane covers, circumferentially around the cavity, those regions of the upper sides of the side walls that lie on the oil.

According to a preferred specific embodiment of the pressure sensor device in accordance with the present invention, the upper sides of the side walls include at least in some regions grooves and/or steps and/or undercuts, for example in each case macrostructural or microstructural, on which the membrane can be fixed.

Through a deviation from the flat realization of the upper sides, an improved anchoring of the later cured membrane to the side walls can be achieved.

Instead of the grooves, other conventional constructive structures that differ from a flat realization of the upper sides of the side walls may be present on the upper sides of the side walls. The groups, steps, and/or undercuts, or other constructive structures, can be large enough to achieve/produce an adhesive and/or materially bonded connection of the membrane and the vessel.

The material of the side walls can for example be made such that a permanent connection can be produced with the monomer or oligomer during the cross-linking, i.e., such that for example they do not repel one another.

According to a preferred specific embodiment of the pressure sensor device in accordance with the present invention, the membrane has a uniform thickness.

According to a preferred specific embodiment of the pressure sensor device in accordance with the present invention, the membrane includes a polymer having reactive groups, or includes a polymer in which reactive groups can subsequently be produced.

Through reactive groups, a curing or cross-linking can take place, for example by increasing/lowering the temperature, or through radiation. For this purpose, all polymers may be suitable that, in the cross-linked state, can be further cross-linked. (Graft-to/graft-from polymerization.) Likewise, polymers may be suitable that can be split by an external action in such a way that reactive groups can arise, for example through UV radiation. Functional groups can be conceivable, and a corresponding additional cross-linking at chain ends, as well as on the chains. As polymerization reactions, current approaches can be suitable, such as radical polymerization, polyaddition, esterification, or others.

According to a preferred specific embodiment of the pressure sensor device in accordance with the present invention, the membrane includes polybutadiene or polyether ether ketone.

The pressure sensor device can also be distinguished by the features disclosed herein in connection with the method, and the advantages thereof, and vice versa.

Further features and advantages of specific embodiments of the present invention result from the following description, with reference to the figures.

BRIEF DESCRIPTION OF THE DRAWINGS

Below, the present invention is explained in more detail on the basis of the exemplary embodiments indicated in the schematic Figures.

In the Figures, identical reference characters designate identical or functionally identical elements.

DETAILED DESCRIPTION OF EXAMPLE EMBODIMENTS

Figure 1:
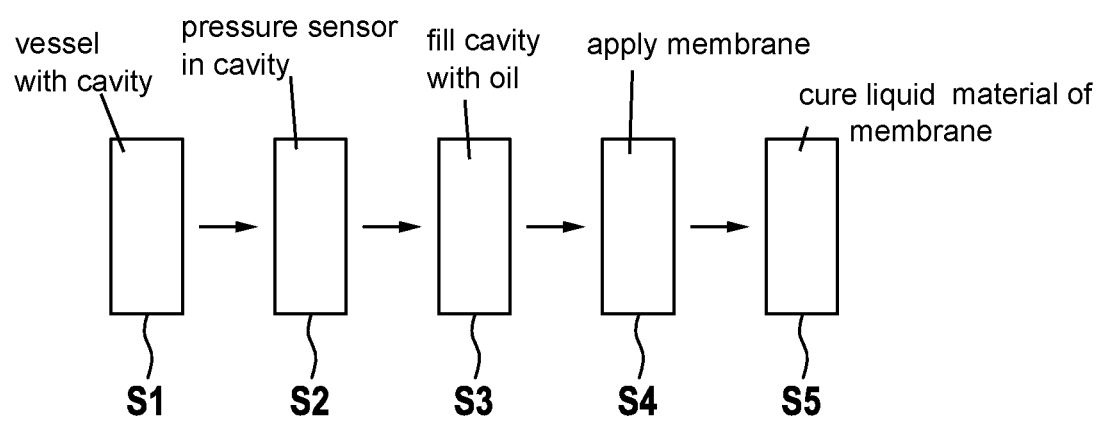
FIG. 1 shows a block diagram of method steps of the method for producing a pressure sensor device according to an exemplary embodiment of the present invention.

FIG. 1 shows a block diagram of method steps of the method for producing a pressure sensor device according to an exemplary embodiment of the present invention.

In the method for producing a pressure sensor device, there takes place a provision S1 of a vessel that includes a cavity having side walls, the cavity having a floor and the side walls each having an upper side facing away from the floor; a provision S2 of a pressure sensor and situation of the pressure sensor in the cavity and on the floor; a filling S3 of the cavity with an oil in such a way that the oil fills the cavity up to the upper sides of the side walls and forms a surface; an application S4 of a membrane onto the surface of the oil that completely covers the oil, and at least in some regions onto the upper sides of the side walls in such a way that the membrane covers, circumferentially around the cavity, those regions of the upper sides of the side walls that lie against the oil, the membrane including a liquid material when applied onto the oil; and a curing S5 of the liquid material of the membrane. Join point residues, such as soldering points, glue tabs, or the like, can here be avoided.

Figure 2A:
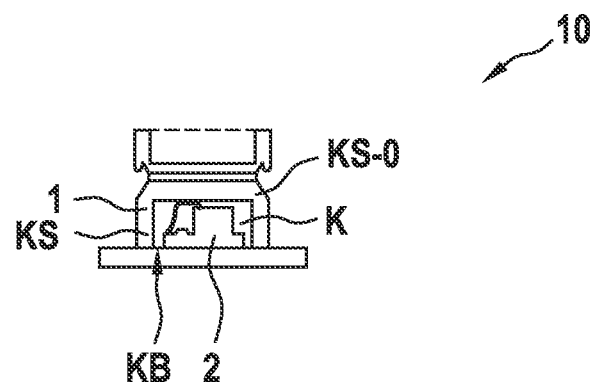
FIGS. 2a-c each show a schematic cross-section of a pressure sensor device during a production method according to an exemplary embodiment of the present invention.
Figure 2B:
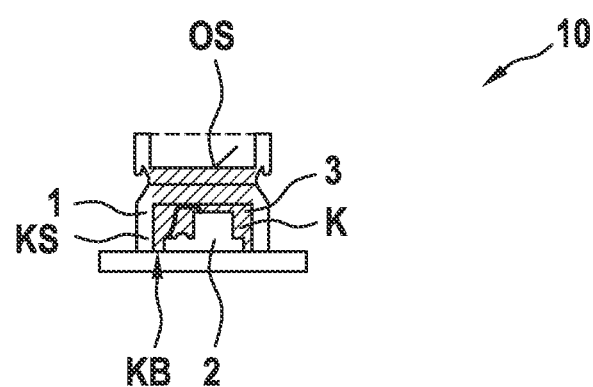
Figure 2C:
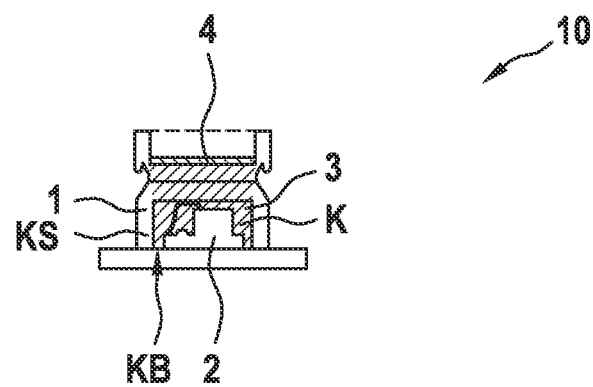

FIGS. 2a-c each show a schematic cross-section of a pressure sensor device during a production method according to an exemplary embodiment of the present invention.

In other words, FIGS. 2a through 2c show method steps of the provision of an empty vessel 1, the filling with oil 3 (FIG. 2b), and the application of a membrane 4 (FIG. 2c), as described in detail in FIG. 1.

In FIG. 2a, a vessel is provided having a cavity K that includes an opening and side walls that run circumferentially around the opening. Pressure sensor 2 can be situated on the floor of the cavity, for example as a MEMS sensor, and can be connected, for example with a bonding wire, to contact points on the floor KB of the cavity.

In a further step of FIG. 2b, the medium 3, preferably a nearly incompressible oil 3, can be filled into cavity K, advantageously in such a way that an upper side OS of oil 3 reaches the same height as side walls KS.

Oil 3 can also laterally surround pressure sensor 2.

As shown in FIG. 2c, an application of a member 4 onto the surface of the oil that completely covers the oil, and at least in some regions onto the upper sides of the side walls, can then take place, in such a way that the membrane covers, circumferentially around the cavity, those regions of the upper sides of the side walls that lie against the oil, the membrane including a liquid material when applied onto the oil. After this step, a curing of the liquid material of the membrane can take place, whereby this membrane then lies with a positive fit on the surface of oil 3, and is joined to side walls KS and is bonded thereto in pressure-tight and water-tight fashion.

The production process can be monitored for example by a laterally mounted camera. The quantity of the oil can be precisely dosed by a microdispersion, and for example can also be observed by the camera.

After the fastening of the membrane 4 to the side walls, a watertight seal can be achieved, and there can be few, or no, gas inclusions between the membrane and the oil, and pressure sensor device 10 is thus completed.

Pressure sensor device 10 of FIG. 2c thus includes a vessel 1 that includes a cavity K having side walls KS, cavity K including a floor KB and the side walls each including an upper side KS-O, which face away from floor KB; a pressure sensor 2 situated in cavity K and on floor KB; an oil 3 with which cavity K is filled in such a way that oil 3 fills cavity K up to the upper sides of side walls KS and forms a surface OS; a membrane 4 that is applied onto surface OS of the oil and lies thereon, the membrane 4 completely covering oil 3 and being applied at least in some regions onto upper sides KS-O of side walls KS in such a way that membrane 4 covers, circumferentially around cavity K, those regions of upper sides KS-O of side walls KS that lie against oil 3.

Although the present invention has been completely described above on the basis of the preferred exemplary embodiment, it is not limited thereto, but can be modified in many ways.

What is claimed is:

1. A method for producing a pressure sensor device, comprising the following steps:
   providing a vessel that includes a cavity having side walls, the cavity including a floor and the side walls each including an upper side, which face away from the floor;
   providing a pressure sensor and situating the pressure sensor in the cavity and on the floor;
   filling the cavity with an oil in such a way that the oil fills the cavity up to the upper sides of the side walls and forms a surface;
   applying a membrane onto the surface of the oil that completely covers the oil and at least in some regions onto the upper sides of the side walls, in such a way that the membrane covers, circumferentially around the cavity, those regions of the upper sides of the side walls that lie against the oil, the membrane including a liquid material when applied onto the oil; and
   curing the liquid material of the membrane,
   wherein the membrane seals the cavity from a surrounding environment in airtight, oil-tight, and watertight fashion,
   wherein the membrane is applied in liquid form,
   wherein the membrane is lipophilic, and wherein inner sides of the side walls are lipophilic.

2. The method as recited in claim 1, in which the pressure sensor device is a microelectromechanical component.

3. The method as recited in claim 1, wherein, before the application of the membrane onto the upper side of the side walls, there takes place a modification of a material property of the surface material of the vessel at least in some regions, after which the surface material becomes capable of being wetted by the material of the membrane and/or by the oil.

4. The method as recited in claim 1, in which the oil is dosed using a microdispersion method and is introduced into the cavity.

5. The method as recited in claim 1, wherein the membrane includes a liquid monomer or oligomer during application.

6. The method as recited in claim 5, wherein the material of the membrane is hardened by radiation or heat after the application onto the oil and onto the upper sides of the side walls.

7. The method as recited in claim 1, wherein the membrane has a homogenous thickness and is applied over the cavity and over the side walls.

8. The method as recited in claim 1, wherein the membrane is applied onto the upper sides of the side walls and onto the oil in such a way that the oil and the upper sides are completely covered, and the material of the membrane is subsequently thinned back to a prespecified thickness.

9. A pressure sensor device, comprising:
   a vessel that includes a cavity having side walls, the cavity including a floor and the side walls each including an upper side, facing away from the floor;
   a pressure sensor that is situated in the cavity and on the floor;
   an oil with which the cavity is filled in such a way that the oil fills the cavity up to the upper sides of the side walls and forms a surface; and
   a membrane that is applied onto the surface of the oil and that lies on the surface, the membrane completely covering the oil and being applied at least in some regions onto the upper sides of the side walls in such a way that the membrane covers, circumferentially around the cavity, those regions of the upper sides of the side walls that lie on the oil,
   wherein the membrane seals the cavity from a surrounding environment in airtight, oil-tight, and watertight fashion,
   wherein the membrane is applied in liquid form,
   wherein the membrane is lipophilic, and wherein inner sides of the side walls are lipophilic.

10. The pressure sensor device as recited in claim 9, wherein the upper sides of the side walls include, at least in some regions, grooves and/or steps and/or undercuts, on which the membrane is fixable.

11. The pressure sensor device as recited in claim 9, wherein the membrane has a uniform thickness.

12. The pressure sensor device as recited in claim 9, wherein the membrane includes a polymer having reactive groups, or includes a polymer in which reactive groups can subsequently be produced.

13. The pressure sensor device as recited in claim 12, wherein the membrane includes polybutadiene or polyether ether ketone.

* * * * *